(12) United States Patent
Loibl

(10) Patent No.: US 9,596,773 B2
(45) Date of Patent: Mar. 14, 2017

(54) ELECTRONIC DEVICE WITH CONNECTOR ARRANGEMENT

(71) Applicant: ZF Friedrichshafen AG, Friedrichshafen (DE)

(72) Inventor: Josef Loibl, Bad Abbach (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 15/046,616

(22) Filed: Feb. 18, 2016

(65) Prior Publication Data

US 2016/0254604 A1    Sep. 1, 2016

(30) Foreign Application Priority Data

Feb. 27, 2015    (DE) .................. 10 2015 203 592

(51) Int. Cl.
*H01R 12/00* (2006.01)
*H05K 5/00* (2006.01)
*H05K 1/14* (2006.01)
*H05K 1/02* (2006.01)

(52) U.S. Cl.
CPC ........... *H05K 5/0082* (2013.01); *H05K 1/147* (2013.01); *H05K 5/0034* (2013.01); *H05K 1/0278* (2013.01); *H05K 2201/10363* (2013.01); *H05K 2203/1327* (2013.01)

(58) Field of Classification Search
CPC ........ H01R 12/71; H01R 12/52; H01R 12/73; H01R 13/24
USPC ...................................... 439/65, 67
See application file for complete search history.

(56) References Cited

U.S. PATENT DOCUMENTS

| | | | | |
|---|---|---|---|---|
| 5,362,243 A | * | 11/1994 | Huss | H01R 13/719 361/749 |
| 5,717,556 A | * | 2/1998 | Yanagida | H05K 1/0278 174/254 |
| 7,371,970 B2 | * | 5/2008 | Flammer | H05K 1/0278 174/254 |
| 8,029,165 B2 | * | 10/2011 | Livesay | H01L 25/075 362/247 |
| 9,065,222 B2 | * | 6/2015 | Drew | H01R 12/71 |

* cited by examiner

*Primary Examiner* — Xuong Chung Trans
(74) *Attorney, Agent, or Firm* — Brinks Gilson & Lione

(57) ABSTRACT

An electronic unit including a plug assembly having at least one plug element comprising a plug base body having numerous plug pins, an assembly carrier printed circuit board, on which at least one electronic component is disposed, and is in electrical contact with at least one conductor path of the assembly carrier printed circuit board, a plug printed circuit board, onto which the plug assembly is attached, and is in electrical contact with at least one conductor path of the plug printed circuit board, and a cohesive cladding element, which seals the plug printed circuit board and at least one section of the assembly carrier printed circuit board against an external environment.

20 Claims, 4 Drawing Sheets

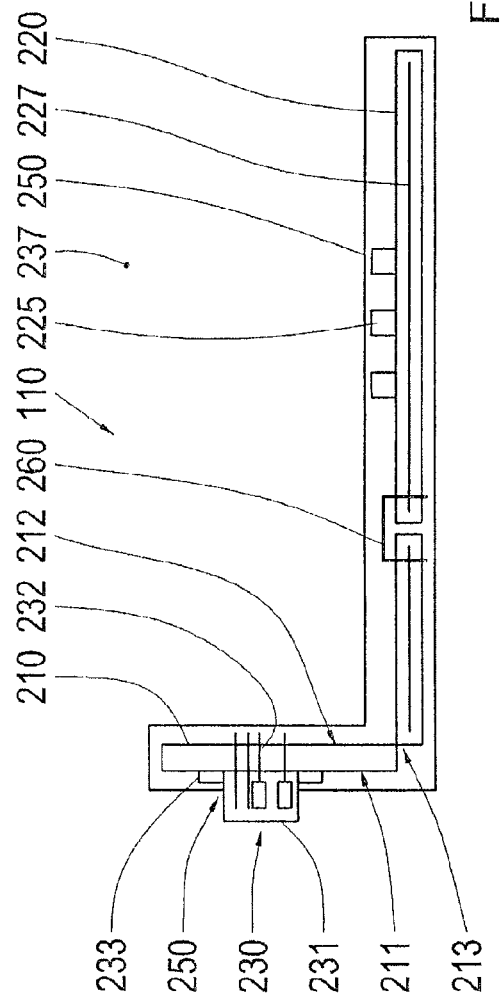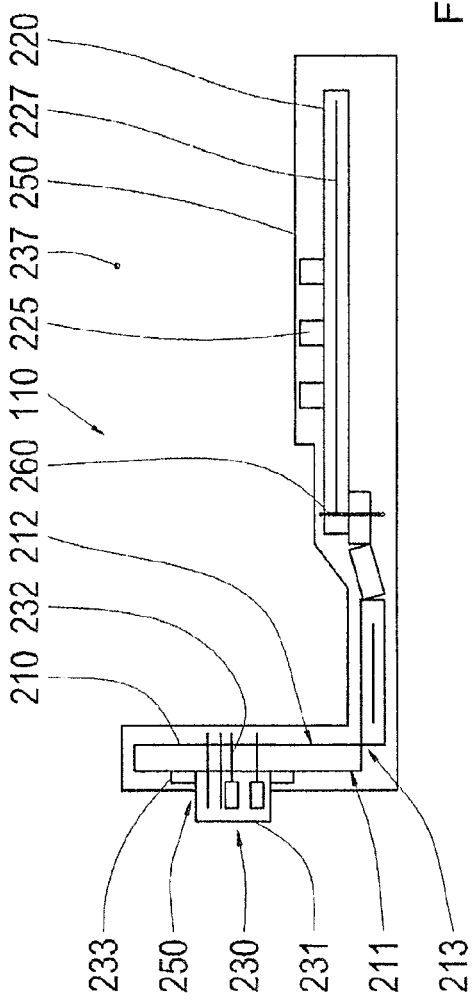

ELECTRONIC DEVICE WITH CONNECTOR ARRANGEMENT

RELATED APPLICATIONS

This application claims the priority of German Patent Application DE-10 2015 203 592.1, filed Feb. 27, 2015, which is incorporated by reference herein in its entirety.

BACKGROUND

1. Technical Field

The present invention relates to an electronic unit with a plug assembly, and a method for producing an electronic unit with a plug assembly according to the main Claims.

2. Background Information

In current series applications for mechanical control devices, an encapsulated electronics system (e.g. a metal housing with glass feed-throughs) and a distribution of signals and currents via lead frames, wires or flexible printed circuit boards is implemented. Electronic control devices tend to be increasingly less expensive, while retaining or expanding their scope of functions. This requires a further development of existing solutions, or the use of novel concepts. In so doing, the connection technologies between individual components, in particular, is of increased interest, because with an increasing miniaturization of the electronic components, the susceptibility to contaminants and vibrations increases. This applies in particular to the field of automotive electronics, in which electronic components must function perfectly with greater reliability, even under the most adverse conditions.

Mechatronic control devices are furthermore provided with plug assemblies in current series applications. Plug assemblies of this type are used for electrical connections of components or suchlike. The plug elements of the plug assembly are also used in sealed chambers subjected to media. As a result, there is a need for plug elements that are sealed accordingly, and ensure that no media can escape from the sealed chamber into the environment, or vice versa. In order to ensure the sealing of the plug, plug elements having a so-called base socketing are used, in which the plug element is entirely coated and the base of the plug is sealed with socketing compound. It is also conceivable that the plug pins have a specialized shape, and are pressed into a thermoplastic. The shape of the plug pins in combination with the grouting ensures a sealing. It has proven, however, to be the case that the aforementioned solutions are complicated in terms of their production, and expensive. Furthermore, the structural construction of the plug element is complex.

BRIEF SUMMARY OF THE INVENTION

With this background, the present invention creates an improved electronic unit with a plug assembly as well as an improved method for producing an electronic unit with a plug assembly in accordance with the main Claims. Advantageous designs can be derived from the dependent Claims and the following description.

Presently, a structural concept for a mechatronic control device with a plug connection is proposed. In particular it is proposed thereby to establish contact with an assembly carrier plate having a plug printed circuit board, wherein a plug assembly is attached to the plug printed circuit board, and at least one electronic component is attached to the assembly carrier plate. Furthermore, it is proposed that the plug printed circuit board and the assembly carrier plate extend, at least in sections, in different planes. As a result, it is possible to obtain a suitable spatial arrangement of the plug printed circuit board and the assembly carrier plate, depending on the application and the installation location. In order to then ensure that the connection between the plug printed circuit board and the assembly printed circuit board is also sufficiently protected against environmental impacts, an appropriately designed cladding element is then provided, which seals off or encapsulates the plug printed circuit board and the transition between the assembly printed circuit board and the plug printed circuit board (in particular in a fluid-tight manner).

The approach presented herein offers the advantage that, using already known technologies for creating electronic units, different circuit components can be produced with the respective inexpensive production technologies, and nevertheless, the entire electronic unit can be composed such that it functions reliably and can be operated without disruptions. In this manner, a very simple and inexpensive electronic unit can be created with already available means, which ensures a high degree of reliability during operation.

Presently, an electronic unit having the following features is proposed:
- a plug assembly having at least one plug element, which comprises a plug base body having numerous plug pins,
- an assembly carrier printed circuit board, on which at least one electronic component is disposed, and having at least one conductor path by means of which the assembly carrier printed circuit board is contacted electrically,
- a plug printed circuit board, onto which the plug assembly is attached, and is contacted electrically with the plug pins by at least one conductor path of the plug printed circuit board, wherein the at least one conductor path of the plug printed circuit board is connected to the at least one conductor path of the assembly carrier printed circuit board in an electrically conductive manner, and wherein the plug printed circuit board extends, at least in sections, in a different plane than the assembly carrier printed circuit board,
- a cohesive cladding element, which seals the plug printed circuit board and at least a section of the assembly carrier printed circuit board against an external environment.

A plug printed circuit board can be understood to be a printed circuit board for providing connections. The plug printed circuit board can be a standardized, simple printed circuit board, thereby, known in the prior art. A plug assembly is understood to be a structural shape of a plug for receiving a socket. The plug element has numerous plug pins thereby, which are attached to a plug base body. An assembly carrier printed circuit board can be understood to be a printed circuit board, which is configured, in particular, for highly integrated electronic circuits, characterized by a high conductor path density, for example, or a high thermal conductivity (and thus serves as an assembly carrier). An electronic component, which is disposed on the assembly carrier printed circuit board and is in electrical contact with a printed circuit board of the assembly carrier printed circuit board, can be understood to be an integrated circuit or a microcontroller, for example, which is configured for control applications. It is also conceivable that numerous components are disposed on the assembly carrier printed circuit board, all of which are either on one main surface of the assembly carrier printed circuit board, or on different main surfaces (populated on both sides) of the assembly carrier printed circuit board. A cladding element can be understood to be an element that enables a sealing (in particular fluid-tight) of a region located under the cladding element against an outer environment of the cladding element.

The plug printed circuit board and the assembly carrier printed circuit board can be, respectively, printed circuit boards having one or more layers, in particular having two layers. For practical purposes, the assembly carrier printed circuit board is a printed circuit board having a high conductor path density with numerous, thus more than two, layers, and the plug printed circuit board is a two-layered printed circuit board. As a result, an inexpensive and easily producible electronic unit is created, because, in particular, the plug printed circuit board has the simplest possible design for receiving the plug assembly.

The plug base body is designed thereby, such that it can accommodate numerous simple contact plugs, also referred to as plug pins. Flat or round contact pins may be used for the plug pins thereby, depending on the application. The plug pins are designed thereby, such that thy are inserted through the printed circuit board. The plug pins form the connection for a socket thereby on the one side of the plug printed circuit board. On the other side of the plug printed circuit board, facing away from the plug, the plug pins can be soldered to an electric conductor path on the plug printed circuit board. The plug pins can also be designed as injection pins, however.

Preferably, the proposed electronic unit can be used in transmission housings, wherein the electronic unit is provided as a part of the transmission control for transmitting electronic signals for controlling the transmission in the transmission housing. Furthermore, the solution also automatically offers protection against contamination of the plug pins, preventing potential short circuits between the plug pins. Other application possibilities are also conceivable.

An embodiment of the present invention in which the at least one plug element is embedded in the cladding element and the plug pins are encapsulated in a fluid-tight manner in the region of the plug printed circuit board by the cladding element against an external environment is advantageous. An embodiment of this type of the present invention offers the advantage that the plug pins as well can be very well protected against environmental impacts and/or vibrations, such that an electronic unit designed in this manner functions very reliably.

The cladding element can encompass the entire surface of the plug printed circuit board, aside from a recess for the plug element, and a section of the assembly printed circuit board, and seal these against the external environment. In particular, the cladding element can be formed by a socketing compound or a coating compound. An embodiment of the present invention of this type offers the advantage of the implementation of a fully developed and inexpensive production method and the use of inexpensive materials, depending on the environmental conditions in which the electronic unit that is to be created will be used.

The plug element is designed such that the plug base body is sealed off from the plug printed circuit board. For practical purposes, supplementary seals are provided, which seal the plug base body against the plug printed circuit board, such that no media can penetrate into the space between the plug printed circuit board and the plug base body toward the plug pins.

According to one embodiment of the present invention, the plug printed circuit board can be connected to the assembly carrier printed circuit board by means of a connecting element in an edge region, in an electrically conductive manner. An embodiment of this type of the present invention offers the advantage of a particularly secure and reliable electrical connection of one or more conductor path(s) of the plug printed circuit board and the assembly carrier printed circuit board.

In another variation of the present invention, the plug printed circuit board forms a section of the assembly printed circuit board. An embodiment of this type offers the advantage that there is no need for an additional printed circuit board, but rather, the assembly printed circuit board can also be used for the plug element. As a result, the plug printed circuit board in the form of a separate printed circuit board can be omitted.

The invention is distinguished in that the available structural space is designed particularly efficiently for the arrangement of the electronic unit, for example, in a vehicle, such that the plug printed circuit board and the assembly printed circuit board extend, at least in part, in different planes. For this, the plug printed circuit board has at least one area having a lesser thickness or a tapering, for folding over the section of the plug printed circuit board supporting the plug element with respect to the assembly carrier printed circuit board.

In order to ensure a functionality of the circuit part, having the other component in a folded section of the plug printed circuit board, in a particularly secure manner, the area of the plug printed circuit board having the lesser thickness can be encompassed by the cladding element in accordance with another embodiment of the present invention. In this manner, the cladding element, as a cohesive cladding element, encompasses at least a section of the assembly carrier printed circuit board in the region of the area of the plug printed circuit board having the lesser thickness.

The plug printed circuit board can be designed as a rigid or flexible printed circuit board. With a flexible printed circuit board, it is possible to design complex geometric shapes with the electronic unit, and thus to adapt the electronic unit, depending on the application, to the available space.

Furthermore, a method for the production of an electronic unit is proposed with the approach presented herein, wherein the method comprises the following steps:

provision of an assembly carrier printed circuit board, on which at least one electronic component is disposed, and to which at least one conductor path of the assembly carrier printed circuit board is electrically contacted, wherein, in the provision step, a plug printed circuit board is also provided, on which a plug assembly having at least one plug element, comprising a plug base body having numerous plug pins, is electrically contacted, retaining the assembly carrier printed circuit board and retaining the plug printed circuit board in a predetermined position in relation to one another, connecting the assembly carrier printed circuit board to the plug printed circuit board, applying a cohesive cladding element, which seals the plug printed circuit board and at least a section of the assembly carrier printed circuit board, at least the section of the assembly carrier printed circuit board at which the assembly carrier printed circuit board is connected to the plug printed circuit board, against an external environment.

BRIEF DESCRIPTION OF THE DRAWINGS

The invention shall be explained in greater detail in an exemplary manner based on the attached drawings.

Therein:

FIG. 2 shows a cross sectional view of an electronic unit in accordance with an exemplary embodiment of the present invention.

FIG. 3 shows a cross-sectional view of another exemplary embodiment of the present invention;

DETAILED DESCRIPTION OF THE DRAWINGS AND THE PRESENTLY PREFERRED EMBODIMENTS

Figure 1:
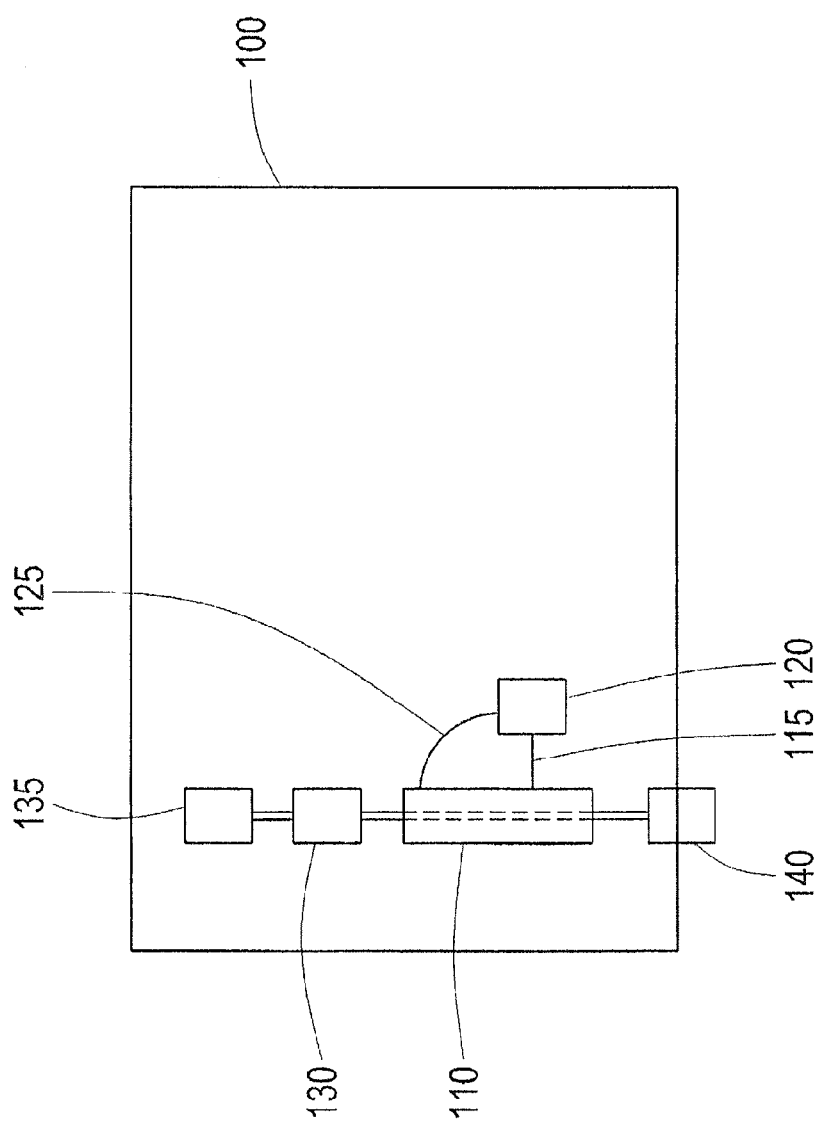
FIG. 1 shows a block diagram of a vehicle, having an electronic unit in accordance with an exemplary embodiment of the present invention.

FIG. 1 shows a block diagram of a vehicle 100, having an electronic unit 110 according to an exemplary embodiment of the present invention. By way of example, the electronic unit 110 may be designed to transmit a control signal 115 to a transmission control unit 120, which in turn transmits a control signal 125 to a transmission, in order to control a force transmission from a motor 135 to a wheel 140. For this, the electronic unit 110 may be disposed, for example, in the region of the wheel 150, and have one or more sensors, as shall be explained in greater detail below, which measure, or measures, or processes, a rotational rate or a speed of the rotation of the wheel 140, for example. In particular, the electronic unit 110 can also be disposed directly in a collective housing with the transmission 130, for example, in order to save on structural space, on one hand, and in order to determine other possible parameters, necessary for the control, such as an oil temperature of an oil in the transmission 130, on the other hand.

FIG. 2 shows a sectional depiction of an electronic unit 110, as it is schematically depicted in FIG. 1. The electronic unit 110 has a plug printed circuit board 210 and an assembly printed circuit board 220 thereby. The assembly carrier printed circuit board 220 is designed with HDI technology, for example. This means that electronic components 225 can be disposed densely, or placed closed together, or wired to the conductor paths 227 running in the assembly carrier printed circuit board. This means, in other words, that the assembly carrier printed circuit board 220 represents a printed circuit board provided for highly integrated circuits. The plug printed circuit board 210 represents a printed circuit board that is less expensive to produce, and is suited for supporting a plug element 230.

By way of example, a plug element 230 is attached to a first main surface 211 of the plug printed circuit board 210. As a matter of course, the plug element 230 can also be disposed on the second main surface 212, or the plug printed circuit board 210 may have at least one plug element 230 on each main surface 211, 212. The plug element 230 has a plug base body 231 and plug pins 232. The plug base body 211 is made from an inexpensive thermoplastic or thermosetting plastic, for example, wherein the plug pins 232 are attached to the plug base body 211. The plug base body 231 is electrically connected, by means of soldering or injection, to plug printed circuit board 210 on the side of the plug element 230 facing away from the plug pins 232. The plug pins 232 pass through openings in the plug printed circuit board thereby. The conductor paths in the plug printed circuit board 210 are not depicted. When the plug pins 232 are injected into, or soldered to, the plug printed circuit board, an electrical connection is produced between the plug pins 232 and the conductor paths of the plug printed circuit board 210.

At least one section of the plug printed circuit board 210 is folded over in relation to the assembly carrier printed circuit board 220. By this means, the plane of this section of the plug printed circuit board has a different alignment than that of the plane of the assembly carrier printed circuit board 220. In order to implement a production of such a fold, the distribution printed circuit board 210 may have a lesser thickness (tapering) at one location 213 than at least one other location. The location 213 having a lesser thickness is formed, for practical purposes, between the plug element 230 and the assembly carrier printed circuit board 220, or an electronic component 225 on the assembly carrier printed circuit board 220, respectively. If the electronic unit 110 is then produced, the section of the plug printed circuit board 210 having the plug element 230 can be very quickly and easily folded over at this location 213, in order to adapt the electronic unit 110 to the given spatial conditions, for example. At the location 213, the recess, or tapering, which can be produced by means of deep milling, for example, should be designed thereby such that the conductor paths on the plug printed circuit board 210 are not damaged or broken, either when the tapering of the plug printed circuit board 210 is produced, or when folding over the section of the of the plug printed circuit board 210 having the plug element 230, because otherwise an electrical connection of the plug printed circuit board 210 and the assembly carrier printed circuit board 220 is not possible. By way of example, the angle between the folded part of the plug printed circuit board 210 and the assembly printed circuit board 220 is ca. 90°. It is also conceivable that, depending on the application and available space, another angle is set.

In order to then ensure a fluid-tight protection of the electrical and mechanical connection between the distribution circuit board 210 and the assembly carrier printed circuit board 220, in particular the connecting element 260, against environmental impacts from the external environment 237, and/or vibrations, a cladding element 250 is then applied, which is produced by an injection, molding, or embedding of at least a portion of the assembly printed circuit board 220, including the electronic components 224 disposed thereon, and the plug printed circuit board 210, including the plug element 230 disposed thereon. The cladding element 250 has a recess 251 thereby. The plug element 240 is placed in this recess 251. For practical purposes, the application of the cladding element 250 occurs surrounding the plug element 230. In order to effectively prevent a penetration of fluids or contaminants into the intermediate space between the plug base body 231 and the plug printed circuit board 210, a sealing element 233 may be provided. This sealing element 233 is disposed surrounding the plug base body 231, and seals off the intermediate space between the plug base body 231 and the plug printed circuit board 210.

The cladding element 250 is designed as a cohesive cladding element and closes the main surfaces 211, 212 of the plug printed circuit board 210, as well as at least the section in which the plug printed circuit board 210 and the assembly carrier printed circuit board 220 are connected. In particular, the connecting element 260 is enclosed, or encased, by the cladding element 250.

The plug printed circuit board 210 and the assembly carrier printed circuit board 220 are connected by means of a connecting element 260. In particular, the conductor paths of the plug printed circuit board 210 are connected to the conductor paths 227 of the assembly printed circuit board 220 thereby. The edge region of the plug printed circuit board 210 and the edge region of the assembly printed circuit board 220, which are connected by means of the connecting element 260, may lay in one plane.

FIG. 3 shows a sectional view of another exemplary embodiment of the present invention as an electronic unit 110. In differing from the exemplary embodiment depicted in FIG. 2, it can be seen in FIG. 3 that the plug printed circuit board 210 has numerous locations 213 having a reduced thickness. Furthermore, the edge regions of the plug printed circuit board 210 and the assembly printed circuit board 220 overlap. The connecting element 260 thus passes through the plug printed circuit board 210 and the assembly printed circuit board 220 such that it is nearly perpendicular.

Figure 4:
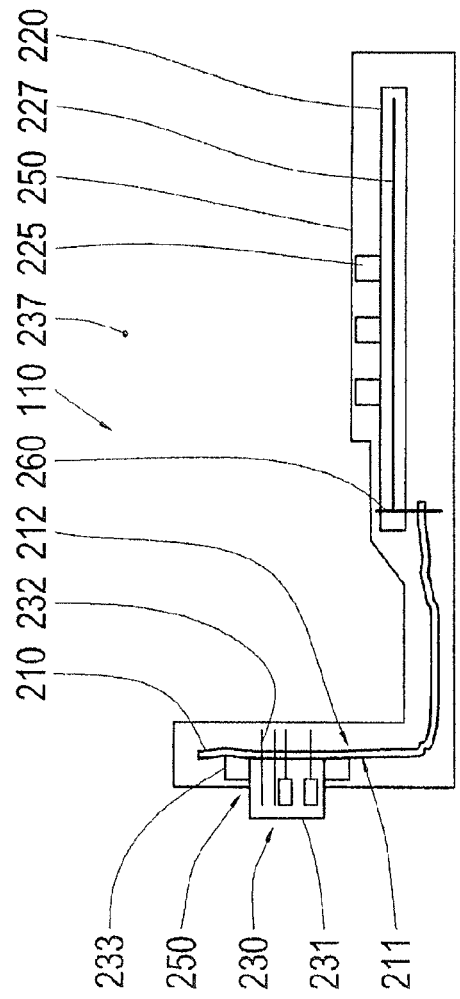
FIG. 4 shows a cross-sectional view of another exemplary embodiment of the present invention.

FIG. 4 shows a sectional view of another exemplary embodiment of the present invention in the form of an electronic unit 110. In differing from the exemplary embodiments depicted in FIG. 2 and FIG. 3, it is visible in FIG. 3 that the plug printed circuit board 210 is a flexible printed circuit board.

Figure 5:
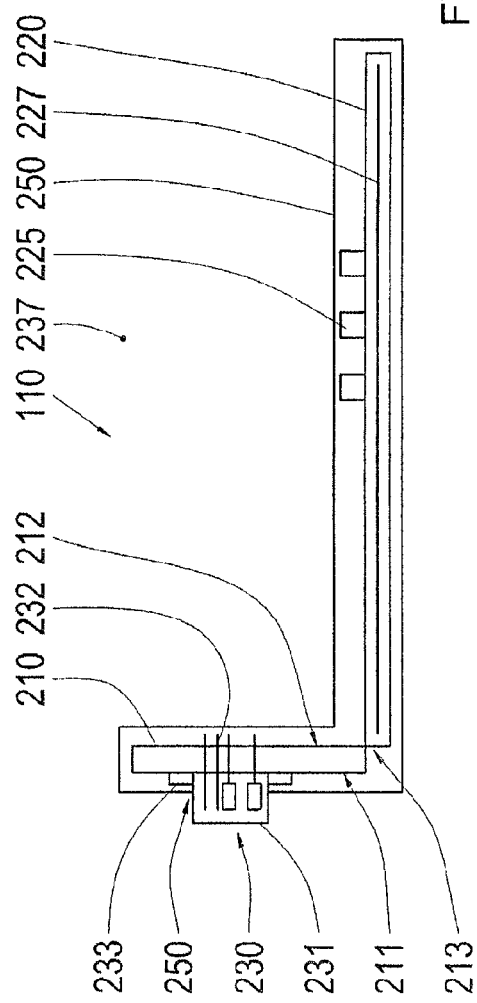
FIG. 5 shows a cross-sectional view of another exemplary embodiment of the present invention.

FIG. 5 shows a sectional view of another exemplary embodiment of the present invention in the form of an electronic unit 110. In differing from the exemplary embodiments depicted in FIGS. 2 to 4, the plug printed circuit board 210 forms a section of the assembly printed circuit board 220. The plug printed circuit board 210 and the assembly carrier printed circuit board 220 thus form a cohesive printed circuit board. The cohesive printed circuit board has a section, which carries at least one plug element 230, and which is folded upward in relation to the section of the printed circuit board that carries the electronic component 225. The cladding element 250 is designed such that it entirely encloses the section of the printed circuit board having the plug element 230, as well as the location 213 having the reduced thickness, and at least one section of the printed circuit board having the electronic component 225, and seals this off from the external environment.

Figure 6:
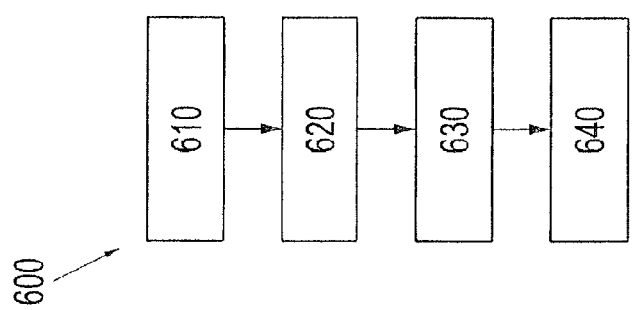
FIG. 6 shows an embodiment of a method for producing the present invention.

FIG. 6 shows an embodiment example of the present invention in the form of a method 600 for producing an electronic unit. The method comprises a step 610 in which an assembly carrier printed circuit board is provided, on which at least one electronic component is disposed, and having at least one conductor path of the assembly carrier printed circuit board that is in electrical contact, wherein, in step 610, the provision step, a plug printed circuit board is also provided, on which a plug assembly having at least one plug element, comprising a plug base body with numerous plug pins, is in electrical contact. Furthermore, the method comprises a step 620, for retaining the assembly carrier printed circuit board and for retaining the plug printed circuit board in a predefined position in relation to one another, and also a step 630 for connecting the assembly carrier printed circuit board to the plug printed circuit board. Lastly, the method 600 comprises a step 640 for applying a cohesive cladding element, which seals the plug printed circuit board and at least one section of the assembly carrier printed circuit board, at least the section of the assembly carrier printed circuit board at which the assembly carrier printed circuit board is connected to the plug printed circuit board, against an external environment.

The exemplary embodiments that are described and shown in the figures are only selected by way of example. Different exemplary embodiments can be combined with one another, either entirely or with respect to individual features. Furthermore, one exemplary embodiment may be supplemented by features of another exemplary embodiment.

Furthermore, method steps according to the invention may be repeated as well as carried out in a different sequence than that described herein.

If an exemplary embodiment comprises an "and/or" conjunction between a first feature and a second feature, this can be read to mean that the exemplary embodiment according to one embodiment includes both the first and second feature, and according to another embodiment, includes only the first feature or only the second feature.

REFERENCE SYMBOLS

100 vehicle
110 electronic unit
115 control signal
120 transmission control unit
125 control signal
130 transmission
135 motor
140 wheel
210 plug printed circuit board
211 first main surface
212 second main surface
213 location with a thinning of the plug printed circuit board, bending location
220 assembly carrier printed circuit board
225 component
227 conductor paths of the assembly printed circuit board
230 plug element
231 plug base body
232 plug pins
233 sealing element
237 external environment
250 cladding element
251 recess in cladding element
260 connecting element
600 method for the production of an electronic assembly
610 providing step
620 retaining step
630 connecting step
640 application step

What is claimed is:

1. An electronic unit comprising:
a plug assembly having at least one plug element comprising a plug base body having a plurality of plug pins;
an assembly carrier printed circuit board, on which at least one electronic component is disposed, and which is in electrical contact with at least one conductor path of the assembly carrier printed circuit board;
a plug printed circuit board, onto which the plug assembly is attached, and having plug pins with which at least one conductor path of the plug printed circuit board is in electrical contact; and
wherein at least one conductor path of the plug printed circuit board is connected in an electrically conductive manner to the at least one conductor path of the assembly carrier printed circuit board; and
wherein the plug printed circuit board extends, at least in sections, in a different plane than that of the assembly carrier printed circuit board;
a cohesive cladding element, which seals the plug printed circuit board, the plurality of plug pins of the plug base body, and at least a section of the assembly carrier printed circuit board against an external environment.

2. The electronic unit of claim 1, wherein the cohesive cladding element has a recess in the region of the plug element.

3. The electronic unit of claim 1, wherein the plug base body of the plug element is sealed off from the plug printed circuit board.

4. The electronic unit of claim 1, wherein the plug printed circuit board has at least one location having a reduced thickness, in order to fold over the adjacent section of the plug printed circuit board.

5. The electronic unit of claim 4, wherein the at least one location having the reduced thickness is encompassed by the cohesive cladding element.

6. The electronic unit of claim 1, wherein the plug printed circuit board is connected to the assembly carrier printed circuit board by means of a connecting element.

7. The electronic unit of claim 1, wherein the plug printed circuit board is a rigid or flexible printed circuit board.

8. The electronic unit of claim 1, wherein the plug printed circuit board forms a section of the assembly carrier printed circuit board.

9. A method for the production of an electronic unit, the method comprising:
providing an assembly carrier printed circuit board, on which at least one electronic element is disposed, and which is in electrical contact with at least one conductor path of the assembly carrier printed circuit board;
providing a plug printed circuit board, on which a plug assembly having at least one plug element is in electrical contact, which plug assembly comprises a plug base body having a plurality of plug pins;
retaining the assembly carrier printed circuit board and retaining the plug printed circuit board in a predefined position in relation to one another; and
applying a cohesive cladding element, which seals the plug printed circuit board, the plurality of plug pins of the plug base body, and at least one section of the assembly carrier printed circuit board, at least the section of the assembly carrier printed circuit board at which the assembly carrier printed circuit board is connected to the plug printed circuit board, against an external environment.

10. The electronic unit of claim 2, wherein the plug base body of the plug element is sealed off from the plug printed circuit board.

11. The electronic unit of claim 2, wherein the plug printed circuit board has at least one location having a reduced thickness, in order to fold over the adjacent section of the plug printed circuit board.

12. The electronic unit of claim 3, wherein the plug printed circuit board has at least one location having a reduced thickness, in order to fold over the adjacent section of the plug printed circuit board.

13. The electronic unit of claim 2, wherein the plug printed circuit board is connected to the assembly carrier printed circuit board by means of a connecting element.

14. The electronic unit of claim 3, wherein the plug printed circuit board is connected to the assembly carrier printed circuit board by means of a connecting element.

15. The electronic unit of claim 4, wherein the plug printed circuit board is connected to the assembly carrier printed circuit board by means of a connecting element.

16. The electronic unit of claim 5, wherein the plug printed circuit board is connected to the assembly carrier printed circuit board by means of a connecting element.

17. The electronic unit of claim 2, wherein the plug printed circuit board is a rigid or flexible printed circuit board.

18. The electronic unit of claim 3, wherein the plug printed circuit board is a rigid or flexible printed circuit board.

19. The electronic unit claim 2, wherein the plug printed circuit board forms a section of the assembly carrier printed circuit board.

20. The electronic unit claim 3, wherein the plug printed circuit board forms a section of the assembly carrier printed circuit board.

* * * * *